(12) United States Patent
Ori et al.

(10) Patent No.: US 12,745,380 B2
(45) Date of Patent: Sep. 22, 2026

(54) ELECTROMAGNETIC WAVE SHIELDING MATERIAL, COVERING MATERIAL OR EXTERIOR MATERIAL, AND ELECTRIC/ELECTRONIC APPARATUS

(71) Applicant: JX Advanced Metals Corporation, Tokyo (JP)

(72) Inventors: Yuki Ori, Ibaraki (JP); Kohei Yokoyama, Ibaraki (JP); Yukito Yamamoto, Ibaraki (JP); Jin Ikegawa, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 36 days.

(21) Appl. No.: 19/101,119

(22) PCT Filed: Oct. 20, 2023

(86) PCT No.: PCT/JP2023/038081
§ 371 (c)(1),
(2) Date: Feb. 4, 2025

(87) PCT Pub. No.: WO2024/101119
PCT Pub. Date: May 16, 2024

(65) Prior Publication Data

US 2026/0075786 A1 Mar. 12, 2026

(30) Foreign Application Priority Data

Nov. 8, 2022 (JP) ................................ 2022-179104

(51) Int. Cl.
*H05K 9/00* (2006.01)

(52) U.S. Cl.
CPC ......... *H05K 9/0088* (2013.01); *H05K 9/0083* (2013.01); *H05K 9/0084* (2013.01); *H05K 9/009* (2013.01)

(58) Field of Classification Search
CPC .......................... H05K 9/0088; H05K 9/0083
See application file for complete search history.

(56) References Cited

U.S. PATENT DOCUMENTS 4,749,625 A 6/1988 Obayashi et al.
5,770,304 A 6/1998 Nakamura et al.
(Continued)

FOREIGN PATENT DOCUMENTS

JP S59-140493 U 9/1984
JP H09-121094 A 5/1997
(Continued)

OTHER PUBLICATIONS

Search Report in International Application No. PCT/JP2023/038081 dated Jan. 9, 2024, 4 pages.
(Continued)

*Primary Examiner* — Hung V Ngo
(74) *Attorney, Agent, or Firm* — MARSHALL, GERSTEIN & BORUN LLP

(57) ABSTRACT

Provided is an electromagnetic wave shielding materials having an improved shape retention property. The electromagnetic wave shielding material includes a laminate with at least one non-magnetic resin layer and at least one non-magnetic metal layer and/or at least one ferromagnetic layer, wherein a value of an anisotropy at break (Rc) represented by the following equation (1) is 0 or less or 1 or more:

[Equation 1]

$$Rc = \frac{\ln\left(\frac{w}{w_0}\right)}{\ln\left(\frac{t}{t_0}\right)} \tag{1}$$

(Continued)

in which:

Rc is an anisotropy at break;

W is a width (mm) of a ruptured portion after a tensile test of the laminate;

$W_0$ is a width (mm) of the laminate before the tensile test;

t is a thickness (μm) of the ruptured portion after the tensile test of the laminate; and $t_0$ is a thickness (μm) of the laminate before the tensile test.

10 Claims, 1 Drawing Sheet

(56) References Cited

U.S. PATENT DOCUMENTS

2018/0079177 A1 3/2018 Tanaka et al.
2018/0177083 A1* 6/2018 Kammuri ................ B32B 27/36
2018/0263145 A1 9/2018 Tanaka
2018/0281350 A1 10/2018 Tanaka
2020/0045859 A1 2/2020 Kagawa
2020/0315073 A1 10/2020 Tanaka
2024/0292583 A1* 8/2024 Fukagawa ............... B32B 27/18
2025/0318095 A1* 10/2025 Yamamoto ........... H05K 9/0088

FOREIGN PATENT DOCUMENTS

JP 2018-171741 A 11/2018
JP 2021-028940 A 2/2021
TW 202007527 A 2/2020

OTHER PUBLICATIONS

Office Action in TW Application No. 11321015040 dated Oct. 4, 2024, 16 pages.

Kiyoshi Maruyama, Plating Practice Handbook, Nikkan Kogyo Shimbun, Ltd., Jun. 30, 1983, pp. 157-160.

International Preliminary Report on Patentability and Written Opinion in International Application No. PCT/JP2023/038081 dated Apr. 29, 2025, 4 pages.

Extended European Search Report in EP Application No. 23888470.4 dated Feb. 2, 2026, 13 pages.

* cited by examiner

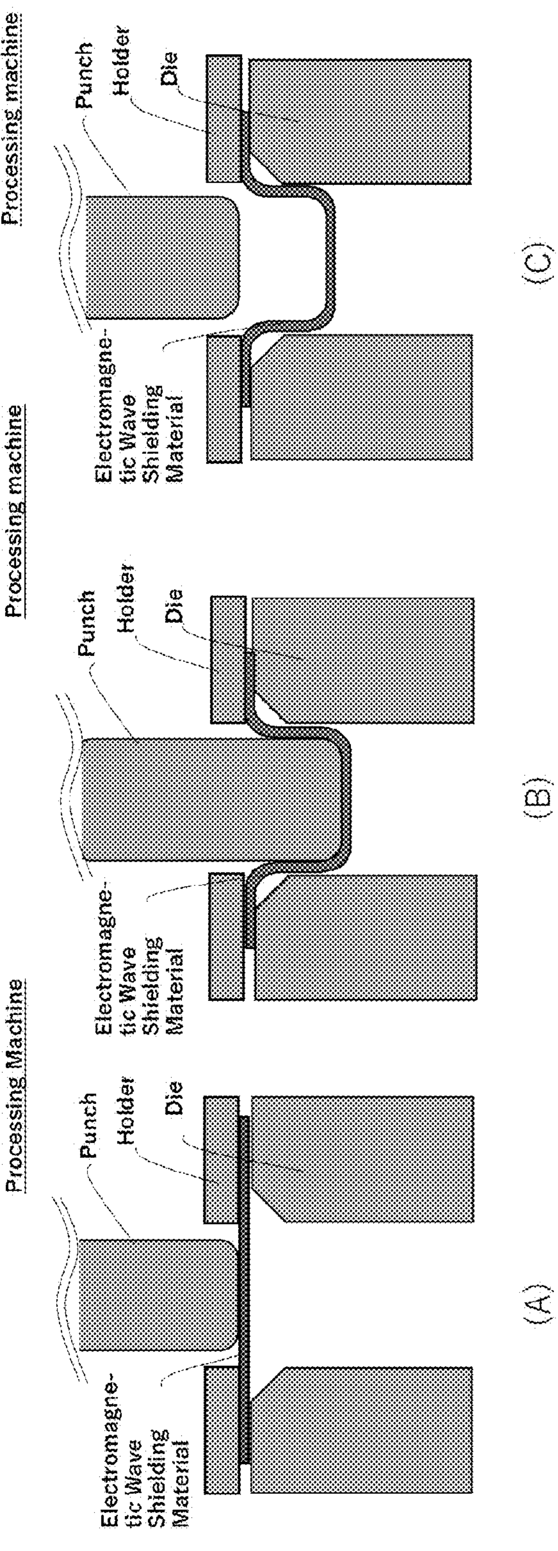
Processing Machine
Punch
Holder
Die
Electromagne-
tic Wave
Shielding
Material
(A)
Processing machine
Punch
Holder
Die
Electromagne-
tic Wave
Shielding
Material
(B)
Processing machine
Punch
Holder
Die
Electromagne-
tic Wave
Shielding
Material
(C)

ELECTROMAGNETIC WAVE SHIELDING MATERIAL, COVERING MATERIAL OR EXTERIOR MATERIAL, AND ELECTRIC/ELECTRONIC APPARATUS

FIELD OF THE INVENTION

The present invention relates to an electromagnetic wave shielding material, a covering material or an external material, and an electric/electronic apparatus.

BACKGROUND OF THE INVENTION

Many environmentally friendly vehicles equipped with secondary batteries, such as electric vehicles and hybrid vehicles, use a system in which the DC current generated by the installed secondary batteries is converted to AC current via an inverter, and the necessary power is then supplied to an AC motor to obtain driving power, and electromagnetic waves are generated due to the switching operation of the inverter, and the like.

In addition, electromagnetic waves are emitted from many electrical and electronic apparatuses, including communication devices, displays, and medical devices, in addition to automobiles. The electromagnetic waves can cause malfunctions in precision devices, and there are also concerns about their effects on the human body.

Typically, in a higher frequency range (1 MHz or more), conductive layers such as copper are known to exhibit good shielding properties against the electromagnetic waves. However, in a lower frequency range (less than 1 MHz), only the conductive layer such as copper results in lower shielding properties against the electromagnetic waves, so it is known that electromagnetic wave shielding materials having alternating layers of magnetic and conductive layers with excellent magnetic permeability exhibit good shielding properties against electromagnetic waves.

The following technique is proposed in Patent Literature 1, for example: "A noise suppression sheet used to suppress a noise of 1 MHz or more, the noise suppression sheet comprising: a noise suppression layer having n magnetic layers having a magnetic layer ($A_1$) and a magnetic layer ($A_n$); and at least (n−1) conductive layers,

- wherein the magnetic layers and the conductive layers are alternately laminated,
- wherein each of the magnetic layers has $X_i$ expressed in the following equation (1) of 1 or more,
- wherein the total of $X_i$ of the magnetic layers is 4 or more and 15 or less, and
- wherein each of the conductive layers has a proportionality constant of 4 or more obtained when linearly approximating a shielding property of 0.2 to 1 MHz in magnetic field shielding measurement using an KEC method:

$$X_i = \sqrt{\mu'_i} \times \sqrt{t_i} \quad \text{Equation (1)}$$

in which n is an integer greater than or equal to 2, i is an integer greater than or equal to 1 and less than or equal to n, $\mu'_i$ is a relative magnetic permeability at 1 MHz of the magnetic layer ($A_i$), and $t_i$ is a thickness [mm] of the magnetic layer ($A_i$)."

CITATION LIST

Patent Literature

[Patent Literature 1] Japanese Patent Application Publication No. 2021-028940 A

SUMMARY OF THE INVENTION

By the way, electromagnetic shielding materials are sometimes subjected to a drawing process to match the shapes of the casings or electronic components and the like, as exterior materials. However, even after forming a shape with a desired height by the drawing process, the height of the formed body cannot be maintained due to the force (spring-back) to be returned to its pre-processed shape being applied to the processed formed body, i.e., the shape cannot be retained. In particular, some materials may return to half their height immediately after processing, which is a problem in industrial production. Therefore, it would be industrially very significant that a shape retention property could be improved for electromagnetic shielding materials. It should be noted that Patent Literature 1 does not focus on the shape retention property as described above.

Therefore, in an embodiment of the present invention, an object of the present invention is to provide an electromagnetic wave shielding material having an improved shape retention property.

As a result of intensive studies to solve the above problems, the present inventors have found that the electromagnetic wave shielding material has an improved shape retention property by including a laminate having at least non-magnetic resin layer and at least one non-magnetic metal layer and/or at least one ferromagnetic layer, and by having a value of an anisotropy at break (Rc) of 0 or less or 1 or more, and they have created the inventions exemplified as follows:

[1]

$A_n$ electromagnetic wave shielding material comprising a laminate with at least one non-magnetic resin layer and at least one non-magnetic metal layer and/or at least one ferromagnetic layer, wherein a value of an anisotropy at break (Rc) represented by the following equation (1) is 0 or less or 1 or more:

[Equation 1]

$$Rc = \frac{\ln\left(\frac{W}{W_0}\right)}{\ln\left(\frac{t}{t_0}\right)} \quad (1)$$

in which:

Rc is an anisotropy at break;

W is a width (mm) of a ruptured portion after a tensile test of the laminate;

$W_0$ is a width (mm) of the laminate before the tensile test;

t is a thickness (μm) of the ruptured portion after the tensile test of the laminate; and $t_0$ is a thickness (μm) of the laminate before the tensile test.

[2]

The electromagnetic wave shielding material according to [1], wherein the laminate has the non-magnetic metal layer, and the electromagnetic wave shielding material has the non-magnetic resin layers on both surfaces of the non-magnetic metal layer.

[3]

The electromagnetic wave shielding material according to [1] or [2], wherein the laminate has the ferromagnetic layer, and the electromagnetic wave shielding material has the non-magnetic resin layers on both surfaces of the ferromagnetic layer.

[4]

The electromagnetic wave shielding material according to any one of [1] to [3], wherein the non-magnetic metal layer has a thickness of 10 to 200 μm and comprises at least one metal having an elongation at break of 2% or more in an RD direction.

[5]

The electromagnetic wave shielding material according to any one of [1] to [4], wherein the non-magnetic metal layer comprises at least one selected from copper, a copper alloy, aluminum, and an aluminum alloy.

[6]

The electromagnetic wave shielding material according to any one of [1] to [5], wherein a value of an anisotropy at break (Rc) of the non-magnetic resin layer represented by the equation (2) is 1.0 or more and 10 or less, or −10 or more and 0 or less:

[Equation 2]

$$Rc = \frac{\ln\left(\frac{w}{w_0}\right)}{\ln\left(\frac{t}{t_0}\right)} \tag{2}$$

in which:

Rc is an anisotropy at break;

W is a width (mm) of a ruptured portion after a tensile test of the non-magnetic resin layer;

$W_0$ is a width (mm) of the non-magnetic resin layer before the tensile test;

t is a thickness (μm) of the ruptured portion after the tensile test of the non-magnetic resin layer; and $t_0$ is a thickness (μm) of the non-magnetic resin layer before the tensile test.

[7]

The electromagnetic wave shielding material according to any one of [1] to [6], wherein the non-magnetic resin layer comprises at least one selected from PET and PC.

[8]

The electromagnetic wave shielding material according to any one of [1] to [7], wherein the non-magnetic resin layer comprises conductive particles and/or conductive fibers.

[9]

A covering material or an exterior material for electrical and electronic apparatuses, the covering material or the exterior material comprising the electromagnetic wave shielding material according to any one of [1] to [8].

An electrical and electronic apparatus comprising the covering material or the exterior material according to [9].

According to an embodiment of the present invention, it is possible to provide an electromagnetic wave shielding material having an improved shape retention property.

BRIEF DESCRIPTION OF THE DRAWINGS

FIGS. 1 (A) to (C) are schematic views for explaining a procedure of a shape retention test.

DETAILED DESCRIPTION OF THE INVENTION

The present invention is not limited to each of the following embodiments, but it can be embodied by modifying its components to the extent that it does not depart from the spirit of the present invention. Also, various inventions can be formed by appropriate combinations of a plurality of components disclosed in each embodiment.

[1. Electromagnetic Wave Shielding Material]

An embodiment of the electromagnetic wave shielding material according to the present invention includes a laminate having at least one non-magnetic resin layer; and at least one non-magnetic metal layer and/or at least one ferromagnetic layer.

Preferred embodiments are described below.

<Laminate>

(Anisotropy at Break)

From the viewpoint of ensuring the improved shape retention property, a value of an anisotropy at break in the laminate is 0 or less or 1 or more. When the electromagnetic wave shielding material is used as an exterior material, it is important to adjust a balance between thinning in the thickness direction and contraction in the width direction of the laminate from the viewpoint of ensuring the improved shape retention property. Therefore, the following equation (1) is defined for the above value of the anisotropy at break.

The anisotropy at break (Rc) refers to a degree of deformation in the thickness and width directions when a plate-shaped specimen is subjected to uniform elongation. When the value of Rc is greater than 0 and less than 1, it indicates a condition where the width of the plate-shaped specimen does not change the width after processing and the thickness decreases. When the value of Rc is 1, it indicates that the thickness and width change at the same percentage before and after processing. When the value of Rc is more than 1, it indicates that the width changes after processing but the thickness remains the same. When forming a single metal by drawing or other forming processes, it was found that materials, which are prone to local elongation ($0<Rc<1$), such as copper and aluminum in particularly, are locally deformed, resulting in rupture and making the forming process itself difficult. It was also found that materials with $0<Rc<1$ have an inferior shape retention property when they are formed by drawing or other forming processes of composite sheets integrally formed by mixing and dispersing metal materials and resins. Based on these results, the present inventors have found that when the metal and the resin are laminated, local deformation is suppressed to result in an easy molding process, thereby easily retaining the shape after forming, when the value of Rc of the laminate is 0 or less or 1 or more, and they have completed the present invention.

[Equation 3]

$$Rc = \frac{\ln\left(\frac{w}{w_0}\right)}{\ln\left(\frac{t}{t_0}\right)} \tag{1}$$

in which:

Rc is an anisotropy at break;

W is a width (mm) of a ruptured portion after a tensile test of the laminate;

$W_0$ is a width (mm) of the laminate before the tensile test;

t is a thickness (μm) of the ruptured portion after the tensile test of the laminate; and $t_0$ is a thickness (μm) of the laminate before the tensile test.

To calculate the above equation (1), each of the width and thickness of the laminate before and after a tensile test is determined, and a ratio of a width strain to a thickness strain is determined based on equations (3) and (4) below. This makes it possible to calculate the value of the anisotropy at break (Rc).

[Equation 4]

$$\frac{\ln\left(\frac{w}{w_0}\right)}{\ln\left(\frac{t}{t_0}\right)} = \frac{\varepsilon_w}{\varepsilon_t} \tag{3}$$

in which:

W is a width (mm) of a ruptured portion after a tensile test of the laminate;

$W_0$ is a width (mm) of the laminate before the tensile test;

t is a thickness (μm) of the ruptured portion after the tensile test of the laminate;

$t_0$ is a thickness (μm) of the laminate before the tensile test;

$\varepsilon_w$ is a width strain; and $\varepsilon_t$ is a thickness strain.

[Equation 5]

$$\frac{\varepsilon_w}{\varepsilon_t} = Rc \tag{4}$$

in which:

$\varepsilon_w$ is a width strain;

$\varepsilon_t$ is a thickness strain; and

Rc is an anisotropy at break.

The method for measuring the width strain and the thickness strain by the tensile test is as follows:

For the evaluation sample, a precision cutter is used to cut the laminate so as to have a width of 12.7 mm, and a cutter or scissors is used to cut the laminate so as to have a length of 10 cm (100 mm). A tabletop precision universal testing machine (Autograph AGS-X, Shimadzu Corporation) is then used to fix the evaluation sample so as to have each length for which each end of the evaluation sample is clamped by gripping tools (chucks), which is a testing jig, in the longitudinal direction, is 20 mm, and have an initial distance between the chucks is 60 mm. The evaluation sample is then pulled in the length direction (longitudinal direction) at a tensile speed of 50 mm/min on the tabletop precision universal testing machine. The tensile test is then terminated when the evaluation sample is broken into two pieces. Based on the above equations (3) and (4), the width strain and the thickness strain for the evaluation sample are calculated from the width and thickness of the sample before and after the tensile test, and the value of Rc is calculated.

As an example of the thickness measurement method required for calculating the value of Rc, it can be measured in accordance with method A in JIS K 6250:2019 using a constant pressure thickness tester (THICKNESS METER B-1, Toyo Seiki Seisaku-sho, Ltd.). The measurement can be carried out at a diameter of the indenter of 5 mm and a pressure on the indenter of 1.22 N. As an example of measuring the width, it can be measured using a caliper after fixing it with tape on a piece of cardboard to prevent the broken part from curling up. For the width after breakage, the width is measured in the direction perpendicular to the longitudinal direction for a portion where it appears to be the minimum width by visual observation, among the nicks that occur near the broken portions.

The laminate can be constructed of a non-magnetic metal layer(s) and/or a ferromagnetic layer(s) closely laminated through a non-magnetic resin layer(s).

For example, if the laminate has the non-magnetic metal layer, it preferably has the non-magnetic resin layers on both surfaces of the non-magnetic metal layer. It is desirable that the laminate is structured such that both surfaces of the non-magnetic metal layer are closely laminated to the non-magnetic resin layers in order to improve the ductility of the non-magnetic metal layer to improve the shape retention property of the laminate. Since a metal foil such as copper and aluminum as a non-magnetic metal layer is prone to local elongation, any local stress concentration can be alleviated by sandwiching the non-magnetic metal layer between the non-magnetic resin layers which are relatively resistant to local elongation. This can ensure the improved shape retention property.

For example, if the laminate has the ferromagnetic layer, it is preferable to have the non-magnetic resin layers on both surfaces of the ferromagnetic layer. The presence of the non-magnetic resin layer can alleviate the local stress concentration. This can ensure the improved shape retention property.

When one surface of the ferromagnetic layer has the non-magnetic metal layer, the other surface opposite to the non-magnetic metal layer of the ferromagnetic layer preferably has the non-magnetic resin layer. By sandwiching the non-magnetic metal layer indirectly between the non-magnetic resin layers, it is expected not only to alleviate the local stress concentration, but also to improve the electromagnetic shielding property, as well as to provide a better shape retention property due to the possession of the layer having the high Young's modulus. Also, the ferromagnetic layer is more preferably a composite sheet (an integrally molded product made by mixing and dispersing the magnetic metal material and the resin). This can ensure the improved shape retention property.

(Structure of Laminate)

Examples of the structure of the laminate include:

(1) When the laminate is comprised of two layers, for example, it includes a non-magnetic resin layer/a ferromagnetic layer; and a non-magnetic resin layer/a non-magnetic metal layer.

(2) When the laminate is composed of three layers, for example, it includes a non-magnetic resin layer/a ferromagnetic layer/a non-magnetic resin layer; a non-magnetic resin layer/a non-magnetic metal layer/a non-magnetic resin layer; a non-magnetic resin layer/a ferromagnetic layer/a non-magnetic metal layer; a non-magnetic resin layer/a non-magnetic metal layer/a ferromagnetic layer; a ferromagnetic layer/a non-magnetic resin layer/a ferromagnetic layer; and a ferromagnetic layer/a non-magnetic resin layer/a non-magnetic metal layer.

(3) When the laminate is composed of four layers, for example, it includes a non-magnetic resin layer/a ferromagnetic layer/a non-magnetic resin layer/a ferromagnetic layer; a non-magnetic resin layer/a non-magnetic metal layer/a non-magnetic resin layer/a non-magnetic metal layer; a non-magnetic resin layer/a non-magnetic metal layer/a ferromagnetic layer/a non-magnetic resin layer; a non-magnetic resin layer/a ferromagnetic layer/a non-magnetic resin layer/a non-magnetic metal layer; and a non-magnetic resin layer/a non-magnetic metal layer/a non-magnetic resin layer/a ferromagnetic resin layer.

(4) When the laminate is composed of five layers, for example, it includes a non-magnetic resin layer/a ferromagnetic layer/a non-magnetic resin layer/a ferromagnetic layer/a non-magnetic resin layer; a non-magnetic resin layer/a non-magnetic metal layer/a non-magnetic resin layer/a non-magnetic metal layer/a non-magnetic resin layer; a non-magnetic resin layer/a non-magnetic metal layer/a ferromagnetic layer/a non-magnetic metal layer/a non-magnetic resin layer; and a non-magnetic metal layer/a non-magnetic resin layer/a ferromagnetic layer/a non-magnetic resin layer/a non-magnetic resin layer.

(5) When the laminate structure is comprised of six or more layers, for example, it includes a non-magnetic resin layer/a ferromagnetic layer/a non-magnetic resin layer/a ferromagnetic layer/a non-magnetic resin layer/a ferromagnetic layer; a non-magnetic resin layer/a non-magnetic metal layer/a non-magnetic resin layer/a non-magnetic metal layer/a non-magnetic resin layer/a non-magnetic metal layer; a non-magnetic resin layer/a non-magnetic metal layer/a ferromagnetic layer/a non-magnetic metal layer/a ferromagnetic layer/a non-magnetic resin layer; and a non-magnetic resin layer/a non-magnetic metal layer/a non-magnetic resin layer/a ferromagnetic layer/a non-magnetic resin layer/a non-magnetic metal layer/a non-magnetic resin layer.

Here, in one embodiment, a single "non-magnetic resin layer" may include a layer made of a plurality of non-magnetic resin layers laminated without the ferromagnetic layer or the non-magnetic metal layer. In other words, in one embodiment, a plurality of non-magnetic resin layers laminated without the ferromagnetic layer or the non-magnetic metal layer is taken as one non-magnetic resin layer.

Also, the non-magnetic resin layer with an adhesive layer laminated without the ferromagnetic layer or the non-magnetic metal layer is taken as one non-magnetic resin layer.

The shielding property tends to be improved when the number of layers of the non-magnetic resin layers and the non-magnetic metal layers and the ferromagnetic layers is larger, while the increased number of the layers laminated increases the amount of work, so that the production cost increases, and the shielding improvement effect tends to be saturated if it exceeds a required number of layers laminated. Therefore, the number of the non-magnetic resin layers in the electromagnetic wave shielding material may be 1 or more, and the number of the non-magnetic metal layers and/or the ferromagnetic layers may be 1 or more.

(Elongation at Break)

From the viewpoint of processability, the elongation at break in the RD direction of the laminate is preferably 10% or more, and more preferably 30% or more. However, in view of the appropriate elongation at brake, the elongation at break in the RD direction is typically 300% or less, and more typically 250% or less.

From the viewpoint of processability, the elongation at break in the TD direction of the laminate is preferably 20% or more, and more preferably 30% or more. However, in view of the appropriate elongation at brake, the elongation at break in the TD direction is typically 300% or less, and more typically 250% or less.

The RD direction means a roll conveying direction of the non-magnetic resin layer and/or the non-magnetic metal layer, and the TD direction means a 90° rotational direction of the RD direction.

The method of measuring elongation at break in each direction is as follows, in accordance with JIS K7127: 1999.

For the evaluation sample, a precision cutter is used to cut the laminate so as to have a width of 12.7 mm, and a cutter or scissors is used to cut the laminate so as to have a length of 10 cm (100 mm). When measuring the elongation at break in the RD direction of the laminate, the production is carried out such that the RD direction of the laminate is the longitudinal direction of the evaluation sample. When measuring the elongation at break in the TD direction of the laminate, the production is carried out such that the TD direction of the laminate is the longitudinal direction of the evaluation sample. Using a test jig of a desktop precision universal testing machine (Autograph AGS-X, Shimadzu Corporation), the evaluation sample is fixed such that each length for which each end of the evaluation sample in the longitudinal direction is clamped by gripping tools (chucks) that are the test jigs is 20 mm, and an initial distance between the chucks is 60 mm. The evaluation sample is then pulled in the length direction (longitudinal direction) at a tensile rate of 50 mm/min on the tabletop precision universal testing machine. The tensile test is terminated when the evaluation sample is broken into two pieces. The elongation at break (%) is defined as a numeric value expressed as a percentage, which is obtained by dividing an amount of length displacement after deformation by the length before deformation.

(Thickness)

From the viewpoint of the shape retention property, the thickness of the laminate is preferably 10 μm or more, and more preferably 20 μm or more, and even more preferably 30 μm or more. However, from the viewpoint of stress on the formed portion of the laminate formed during processing, the thickness of the laminate is preferably 800 μm or less, and more preferably 700 μm or less, and even more preferably 600 μm or less.

The thickness of the laminate is measured as follows: The thickness can be measured in accordance with method A in JIS K 6250:2019 using a constant-pressure thickness tester (THICKNESS METER B-1, Toyo Seiki Seisakusho, Ltd.). In addition, the diameter of the indenter is 5 mm and the pressure onto the indenter is 1.22 N.

(Lamination Method)

The method of laminating the non-magnetic resin layer and the ferromagnetic layer or the non-magnetic metal layer may be done by using an adhesive between the non-magnetic resin layer and the ferromagnetic layer or between the non-magnetic resin layer and the non-magnetic metal layer, or by thermocompression-bonding the non-magnetic resin layer to the ferromagnetic layer or the non-magnetic metal layer without using any adhesive. The method of simply overlapping the layers without using any adhesive is also acceptable, but in view of the unity of the electromagnetic wave shielding material, it is preferable to join at least the end portions (e.g., each side if the shielding material is square) by a tape or an adhesive, or by thermocompression bonding. However, from the viewpoint of not applying excess heat to the ferromagnetic layer, it is preferable to use the adhesive. Non-limiting examples of the adhesive include acrylic resin-based, epoxy resin-based, urethane-based, polyester-based, silicone resin-based, vinyl acetate-based, styrene butadiene rubber-based, nitrile rubber-based, phenol resin-based, and cyanoacrylate-based adhesives, and the urethane-based, polyester-based, and vinyl acetate-based adhesives are preferred for the reasons of ease of production and costs.

<Non-Magnetic Resin Layer>

The non-magnetic resin layer contains a resin composition that does not exhibit diamagnetic or paramagnetic properties. As for the non-magnetic resin layer, a layer with a large impedance difference between the non-magnetic resin layer and the ferromagnetic layer or the non-magnetic metal layer is preferable in order to obtain the improved electromagnetic shielding property. To produce the large impedance difference, a lower relative permittivity of the non-magnetic resin layer is required, and specifically it is preferably 10 (a value at 20° C.; the same applies hereinafter) or less, and preferably 5.0 or less, and even more preferably 3.5 or less. In principle, the relative permittivity cannot be less than 1.0. With commonly available materials, it can be as low as about 2.0, and even if it is lower to be close to 1.0, the improvement of the shielding property is limited, while the material itself becomes special and expensive. In view of the balance between the cost and the shielding property, the relative permittivity is preferably 2.0 or more, and more preferably 2.2 or more, and even more preferably 2 or more.

As a material for the non-magnetic resin layer, a synthetic resin is preferred from the viewpoint of processability. Also, a film-shaped material can be used as a material making up the non-magnetic resin layer. The non-magnetic resin layer can also be mixed with a fiber-reinforced material such as carbon fiber, glass fiber and aramid fiber. The synthetic resins include polyesters such as PET (polyethylene terephthalate), PC (polycarbonate), PEN (polyethylene naphthalate) and PBT (polybutylene terephthalate); olefinic resins such as polyethylene and polypropylene; polyamides; polyimides; liquid crystal polymers; polyacetals; fluororesins; polyurethanes; acrylic resins; epoxy resins; silicone resins; phenol resins; melamine resins; ABS resins; polyvinyl alcohols; urea resins; polyvinyl chloride; polystyrenes; styrene butadiene rubbers, etc., from the viewpoint of availability and processability, and among these, PET, PC, polyamide and polyimide are preferable in terms of tensile strength and ductility. In addition, elastomers such as urethane rubbers, chloroprene rubbers, silicone rubbers, fluororubbers, styrene-based, olefin-based, polyvinyl chloride-based, urethane-based, and amide-based elastomers can be applied as the synthetic resins. Among these, polyimide, polybutylene terephthalate, polyamide, polyurethane, and the like, which are easily bonded to metal foil by thermocompression bonding, can be suitably used. All the non-magnetic resin layers used for the laminate may be made of the same resin material, or may be made of different resin layers for each layer.

In a further embodiment, the non-magnetic resin layer may contain conductive particles and/or conductive fibers. For example, copper, copper alloys, aluminum, aluminum alloys, carbon, and the like can be used as the metal species of the conductive particles and the conductive fibers, as long as they have good electrical conductivity.

In this case, a mass ratio of the resin and the conductive particles or the conductive fibers is, for example, 70:30 to 1:99.

Various surface treatments may be applied to the surface of the non-magnetic resin layer to promote adhesion to the non-magnetic metal layer or the ferromagnetic layer. For example, the adhesion between the resin film and the metal foil can be improved by carrying out a primer coating or corona treatment on the lamination surface of the resin film as the non-magnetic resin layer to the metal foil as the non-magnetic metal layer.

(Anisotropy at Break)

From the viewpoint of shape formability such as a drawing process, the value of the anisotropy at break for the non-magnetic resin layer is preferably 1.0 or more and 10 or less or −10 or more and 0 or less, and more preferably 1.2 or more and 5 or less, or −5 or more and −0 or less. The following equation (2) is defined for the above value of the anisotropy at break. In the equation (2) below, the methods of measuring ($\ln(W/W_0)$), which represents the width strain, and ($\ln(t/t_0)$), which represents the thickness strain, are the same as the method of measuring the value of the anisotropy at break for the laminate as described above.

[Equation 6]

$$Rc = \frac{\ln\left(\frac{w}{w_0}\right)}{\ln\left(\frac{t}{t_0}\right)} \quad (2)$$

in which:

Rc is an anisotropy at break;

W is a width (mm) of a ruptured portion after a tensile test of the non-magnetic resin layer;

$W_0$ is a width (mm) of the non-magnetic resin layer before the tensile test;

t is a thickness (μm) of the ruptured portion after the tensile test of the non-magnetic resin layer; and $t_0$ is a thickness (μm) of the non-magnetic resin layer before the tensile test.

(Elongation at Break)

From the viewpoint of shape formability such as a drawing process, the elongation at break in the RD direction of the non-magnetic resin layer is preferably 10% or more, and more preferably 20% or more, and even more preferably 80% or more. However, in view of the appropriate elongation at brake, the elongation at break in the RD direction is typically 500% or less, and more typically 400% or less.

From the viewpoint of shape formability such as a drawing process, the elongation at break in the TD direction of the non-magnetic resin layer is preferably 10% or more, and more preferably 20% or more, and even more preferably 80% or more. However, in view of the appropriate elongation at brake, the elongation at break in the TD direction is typically 500% or less, and more typically 400% or less.

The method of measuring the elongation at break in each direction is the same as the method of measuring the elongation at break in each direction of the laminate as described above.

(Thickness)

The thickness of the non-magnetic resin layer is not particularly limited, but from the viewpoint of processability, the total thickness of the non-magnetic resin layers is preferably 40 μm or more, and more preferably 50 μm or more, and even more preferably 100 μm or more, and still more preferably 200 μm or more. However, from the viewpoint of cost reduction, the total thickness of the non-magnetic resin layers is preferably 500 μm or less, and more preferably 400 μm or less, and even more preferably 300 μm or less.

In view of ease of handling, the thickness per layer of the non-magnetic resin layer is preferably 5 μm or more, and more preferably 20 μm or more, and even more preferably 25 μm or more. However, the thickness per layer of the non-magnetic resin layer is preferably 500 μm or less, and more preferably 300 μm or less, because an excessively large thickness will result in high cost (poor cutting processability).

The method of measuring the thickness of the non-magnetic resin layer is the same as the method of measuring the thickness of the laminate as described above.

(Thickness of Adhesive Layer)

The adhesive layer is laminated on the surface of the non-magnetic resin layer and contains an adhesive. In view of formability such as drawing, adhesives with lower strength than the resin films are often used. Therefore, if the adhesive layer is too thick, laminating the non-magnetic resin layer having the adhesive layer may inhibit the improvement of ductility of the ferromagnetic layer or the non-magnetic metal layer. On the other hand, if the adhesive layer is too thin, it is difficult to apply the adhesive to the entire interface between the ferromagnetic layer or non-magnetic metal layer and the non-magnetic resin layer, and non-bonded portions may be formed. Therefore, the thickness of the adhesive layer is preferably 1 μm or more and 20 μm or less, and more preferably 1 μm or more and 10 μm or less, and even more preferably 3 μm or more and 9 μm or less. The adhesive layer may further contain conductive particles or conductive fibers to the extent that they do not interfere with the present invention.

The method of measuring the thickness of the adhesive layer is the same as the method of measuring the thickness of the laminate as described above.

<Ferromagnetic Layer>

The ferromagnetic layer has electromagnetic wave absorption properties and has a specific magnetic permeability of approximately 10 to 50000 at a frequency of 1 MHz. The ferromagnetic layer contains a magnetic metal material with high specific magnetic permeability, and examples include a composite sheet integrally formed by mixing and dispersing the magnetic metal material and a resin, and a metal foil. The composite sheet is preferred from the viewpoint of processability and/or light weight.

In addition, the general method of measuring the specific permeability is as follows: The measurement sample is processed into a toroidal shape (an outer diameter of 6.93 to 6.96 mm and an inner diameter of 3.06 to 3.10 mm) using a punching die or the like, and the specific permeability can be measured using a vector network analyzer (ENA E5071C, Keysight).

When the ferromagnetic layer is the composite sheet, the resin contained in the composite sheet includes natural and synthetic resins, and the synthetic resins are preferred from the viewpoint of processability. These materials can also be mixed with fiber-reinforced materials such as carbon fiber, glass fiber and aramid fiber.

The synthetic resins include polyesters such as PET (polyethylene terephthalate), PC (polycarbonate), PEN (polyethylene naphthalate) and PBT (polybutylene terephthalate); olefinic resins such as polyethylene and polypropylene; polyamides; PIs (polyimides); LCPs (liquid crystal polymers); polyacetals; fluororesins; polyurethanes; acrylic resins; epoxy resins; silicone resins; phenol resins; melamine resins; ABS resins; polyvinyl alcohols; urea resins; polyvinyl chloride; polystyrenes; styrene butadiene rubbers, etc., from the viewpoint of availability and processability, and among these, PET, PC, PEN, polyamide, and PIs are preferred for reasons of processability and costs. In addition, elastomers such as urethane rubbers, chloroprene rubbers, silicone rubbers, fluororubbers, styrene-based, olefin-based, polyvinyl chloride-based, urethane-based, and amide-based elastomers can be applied as the synthetic resins. Furthermore, the synthetic resin itself may serve as an adhesive. Non-limiting examples of the adhesives include acrylic resin-based, epoxy resin-based, urethane-based, polyester-based, silicone resin-based, vinyl acetate-based, styrene butadiene rubber-based, nitrile rubber-based, phenol resin-based, and cyanoacrylate-based adhesives, and the urethane-based, polyester-based, and vinyl acetate-based adhesives are preferred for the reasons of ease of production and costs.

The composite sheet can be laminated in a form of a film or fiber onto the non-magnetic resin layer or the non-magnetic metal layer. Although the composite sheet can be formed by applying a mixed, uncured composition of a magnetic metal material and a resin to a resin substrate having a release layer and then curing it, and then peeling it off from the resin substrate, for example, the composite sheet may be formed by applying a mixed, uncured composition of a magnetic metal material and a resin to the surface of the non-magnetic resin layer or to the surface of the non-magnetic metal layer or to a treated film as described later and then curing it. A composite sheet that can be affixed to the surface of the non-magnetic resin layer or to the surface of the non-magnetic metal layer or the treated film described below is preferred for a reason of ease of production.

In addition, the mass ratio of the resin and the magnetic metal material in the composite sheet is, for example, 70:30 to 1:99. Also, the composite sheet may further contain conductive particles or conductive fibers other than magnetic metal materials to the extent that they do not interfere with the present invention. The examples of the conductive particles and the conductive fibers are the same as those of the conductive particles and the conductive fibers in the non-magnetic resin layer as described above.

When the ferromagnetic layer is a metal foil, the ferromagnetic layer preferably contains at least one selected from nickel, iron, Permalloy (Ni—Fe alloy) and Sendust (Fe—Si—Al alloy). Since these materials have relatively high specific magnetic permeability, they can collect the magnetic flux components in the noise and reduce the spatial magnetic field.

(Elongation at Break)

From the viewpoint of processability such as drawing, the elongation at break in the RD direction of the ferromagnetic layer is preferably 5% or more, and more preferably 10% or more. However, in view of the appropriate elongation at brake, the elongation at break in the RD direction is typically 100% or less, and more typically 70% or less.

From the viewpoint of processability such as drawing, the elongation at break in the TD direction of the ferromagnetic layer is preferably 5% or more, and preferably 10% or more. However, in view of the appropriate elongation at brake, the elongation at break in the TD direction is typically 100% or less, and more typically 70% or less.

The method of measuring the elongation at break in each direction is the same as the method of measuring the elongation at break in each direction of the laminate described above.

(Thickness)

The thickness of the ferromagnetic layer is not particularly limited, but from the viewpoint of the electromagnetic shielding property, the total thickness of the ferromagnetic layers is preferably 10 μm or more, and more preferably 15 μm or more, and even more preferably 20 μm or more, and still more preferably 25 μm or more, and even more preferably 30 μm or more. However, from the viewpoint of cost reduction, the total thickness of the ferromagnetic layer is preferably 500 μm or less, and more preferably 300 μm or less, and even more preferably 200 μm or less.

In one embodiment, from the viewpoint of stress on the formed portion of the laminate formed during processing, the thickness per layer of the ferromagnetic layer is preferably 5 μm or more, and more preferably 10 μm or more, and even more preferably 20 μm or more, and still more preferably 25 μm or more, and even more preferably 30 μm or more, and still more preferably 35 μm or more. However, the thickness per layer of the ferromagnetic layer is preferably less than 100 μm, as an excessively large thickness will increase costs.

The method of measuring the thickness of the ferromagnetic layer is the same as the method of measuring the thickness of the laminate as described above.

In an embodiment, when multiple ferromagnetic layers are formed, all the ferromagnetic layers may be made of the same material, or may be made of different materials for each layer. Also, all the ferromagnetic layers may have the same thickness, or different thicknesses for each layer.

<Non-Magnetic Metal Layer>

The non-magnetic metal layer is composed of a metal material that exhibits diamagnetic or paramagnetic properties. In one embodiment, the material of the non-magnetic metal layer to be used is not particularly limited, but from the viewpoint of enhancing the shielding property against alternating magnetic fields and alternating electric fields, it is preferably a metal material with improved electrical conductivity. Specifically, it is preferably formed of a material having an electrical conductivity of $1.0\times10^6$ S/m (which is a value at 20° C.; the same applies hereinafter), and more preferably an electrical conductivity of $10.0\times10^6$ S/m or more, and even more preferably an electrical conductivity of $30.0\times10^6$ S/m or more, and most preferably an electrical conductivity of $50.0\times10^6$ S/m or more. Such a metal includes aluminum having an electrical conductivity of about $39.6\times10^6$ S/m, and copper having an electrical conductivity of about $58.0\times10^6$ S/m. In other words, it is suitable that the non-magnetic metal layer contains at least one selected from copper, copper alloys, aluminum, and aluminum alloys, in view of both conductivity and cost. These are preferred for practicality.

(Elongation at Break)

From the viewpoint of formability, the elongation at break in the RD direction of the non-magnetic metal layer is preferably 2% or more, and more preferably 5% or more. However, in view of the appropriate elongation at brake, the elongation at break in the RD direction is typically 80% or less, and more typically 60% or less.

From the viewpoint of processability, the elongation at break in the TD direction of the non-magnetic metal layer is preferably 2% or more, and more preferably 5% or more. However, in view of the appropriate elongation at brake, the elongation at break in the TD direction is typically 80% or less, and more typically 60% or less.

The method of measuring elongation at break in each direction is the same as the method of measuring elongation at break in each direction of the laminate described above.

(Thickness)

The thickness of the non-magnetic metal layer is not particularly limited, but from the viewpoint of the shape retention property, the total thickness of the non-magnetic metal layers is preferably 10 μm or more, and more preferably 15 μm or more, and even more preferably 20 μm or more, and still more preferably 25 μm or more, and even more preferably 30 μm or more. However, from the viewpoint of cost reduction, the total thickness of the non-magnetic metal layers is preferably 500 μm or less, and more preferably 300 μm or less, and even more preferably 100 μm or less.

In one embodiment, from the viewpoint of the shielding property, the thickness per layer of the non-magnetic metal layer is preferably 5 μm or more, and more preferably 10 μm or more, and even more preferably 15 μm or more. However, the thickness per layer of the non-magnetic metal layer is preferably 200 μm or less, and more preferably 160 μm or less, and even more preferably 100 μm or less, because an excessively large thickness will result in higher costs.

The method of measuring the thickness of the non-magnetic metal layer is the same as the method of measuring the thickness of the laminate as described above.

In an embodiment, when multiple non-magnetic metal layers are formed, all the non-magnetic metal layers may be made of the same material, or may be made of different materials for each layer. Also, all the non-magnetic metal layers may have the same thickness, or different thicknesses for each layer. The treated film described below is also considered as part of the non-magnetic metal layer.

The non-magnetic metal layer is not limited to one having any particular shape, but an example is a metal foil. When copper foil is used as the metal foil, it preferably has high purity, and it preferably has a purity of 99.5% by mass or more, more preferably 99.8% by mass or more, as it improves the shielding property. A rolled copper foil, electrodeposited copper foil, and metallized copper foil can be used as the copper foil, and the rolled copper foil is preferred because of its superior bendability and formability. When alloying elements are added to the copper foil to make the copper alloy foil, the total content of these elements and unavoidable impurities may be less than 0.5% by mass. In particular, the total content of 50 to 5000 ppm by mass of at least one selected from tin, manganese, chromium, zinc, zirconium, magnesium, nickel, silicon, and silver, and/or 10 to 50 ppm by mass of phosphorus in the copper foil is/are preferable because it improves elongation compared to a pure copper foil having the same thickness.

<Treated Film>

At least one surface of the non-magnetic metal layer may further have a treated film made of an alloy containing copper, and both of the surfaces of the non-magnetic metal layer may further have the above treated films. In this case, it is preferable that the ferromagnetic layer and the non-magnetic metal layer are placed via the treated film, from the viewpoint of efficient absorption and attenuation of electromagnetic waves in the ferromagnetic layer. The treated film is formed, for example, on the surface on the ferromagnetic layer side of the non-magnetic metal layer adjacent to the ferromagnetic layer.

From the viewpoint of enhancing the shielding property, the treated film may further include, as an example, one or more selected from electromagnetic wave absorption auxiliary films of an alloy containing copper, heat resistant films, rust preventive films, and weather resistant films, which are formed on at least one surface of the non-magnetic metal layer. The heat resistant-treated heat resistant films include plated films and vapor-deposited films containing cobalt and/or nickel, and the like, and the rust preventive-treated rust preventive films include inorganic plated films and vapor-deposited films such as zinc and chromium, and organic films such as benzotriazole, and the silane coupling-treated weather resistant films include organic coated films containing silane coupling agents. In other words, one or more metals selected from cobalt, nickel, zinc, molybdenum, tin, phosphorus, tungsten, chromium, and silicon may be further included in the treated film.

In addition, when the ferromagnetic layer is a composite sheet containing a resin, the treated film interposed between the ferromagnetic layer and the non-magnetic metal layer can also improve adhesiveness between the ferromagnetic layer and the non-magnetic metal layer.

The electromagnetic wave absorption auxiliary film can be produced by known methods, such as plating, metal deposition, and sputtering. In particular, a method of forming an electromagnetic wave absorption auxiliary film composed of copper, an electromagnetic wave absorption auxiliary film composed of copper and nickel, or an electromagnetic wave absorption auxiliary film composed of copper, cobalt and nickel by plating on the surface of the non-magnetic metal layer is described below as an example.

In the plating process to form the electromagnetic wave absorption auxiliary film, a particle film consisting of copper, a particle film consisting of copper and nickel, or a particle film consisting of copper, cobalt and nickel is formed on at least one surface of the non-magnetic metal layer.

(Plating Conditions (Roughening Plating Process) 1: Plating of Copper)

An example of the plating conditions for copper is as follows:

- Liquid composition: 10 to 23 g/L of copper, 45 to 110 g/L of sulfuric acid;
- Liquid temperature: 20 to 55° C.;
- Current density: 10 to 60 A/dm$^2$; and
- Coulomb amount: 5 to 30 As/dm$^2$.

(Plating Conditions (Roughening Plating Process) 2: Plating of Copper and Nickel Alloy)

An example of the plating conditions for copper and nickel is as follows:

- Liquid composition: 10 to 20 g/L of copper, 5 to 15 g/L of nickel;
- pH: 2 to 3;
- Liquid temperature: 30 to 50° C.;
- Current density: 10 to 65 A/dm$^2$; and
- Coulomb amount: 10 to 50 As/dm$^2$.

(Plating Conditions (Roughening Plating Process) 3: Plating of Copper, Cobalt and Nickel Alloy)

An example of the plating conditions for copper, cobalt, and nickel is as follows:

- Liquid composition: 10 to 20 g/L of copper, 5 to 15 g/L of cobalt, 5 to 15 g/L of nickel;
- pH: 2 to 3;
- Liquid temperature: 30 to 50° C.;
- Current density: 10 to 65 A/dm$^2$; and
- Coulomb amount: 10 to 48 As/dm$^2$.

In this case, the roughening plating process can be performed in multiple stages under the above plating conditions 1 to 3.

In the heat resistant treatment, at least one of the following heat resistant films 1-8 can be further formed on the electromagnetic wave absorption auxiliary film as described above. The respective plating and deposition conditions are shown below.

(Plating Conditions for Heat Resistant Film 1) (Co—Ni Plating: Plating of Cobalt-Nickel Alloy)

- Liquid composition: 5 to 20 g/L of nickel, 1 to 8 g/L of cobalt;
- pH: 2 to 3;
- Liquid temperature: 40 to 60° C.;
- Current density: 10 to 30 A/dm$^2$; and
- Coulomb amount: 2 to 20 As/dm$^2$.

(Plating Conditions for Heat Resistant Film 2) (Ni—Zn Plating: Plating of Nickel-Zinc Alloy)

- Liquid composition: 2 to 30 g/L of nickel, 2 to 30 g/L of zinc;
- pH: 3 to 4;
- Liquid temperature: 30 to 50° C.;
- Current density: 1 to 10 A/dm$^2$; and
- Coulomb amount: 0.5 to 2 As/dm$^2$.

(Plating Conditions for Heat Resistant Film 3) (Ni—Cu Plating: Plating of Nickel-Copper Alloy)

- Liquid composition: 2 to 30 g/L of nickel, 2 to 30 g/L of copper;
- pH: 3 to 4;
- Liquid temperature: 30 to 50° C.;
- Current density: 1 to 2 A/dm$^2$; and
- Coulomb amount: 1 to 2 As/dm$^2$.

(Plating Conditions for Heat Resistant Film 4) (Ni—Mo Plating: Plating of Nickel-Molybdenum Alloy)

- Liquid composition: Ni sulfate hexahydrate: 45 to 55 g/dm$^3$, sodium molybdate dihydrate: 50 to 70 g/dm$^3$, sodium citrate: 80 to 100 g/dm$^3$;
- pH: 1.5 to 4.5;
- Liquid temperature: 20 to 40° C.;
- Current density: 1 to 4 A/dm$^2$; and
- Coulomb amount: 1 to 2 As/dm$^2$.

(Plating Conditions for Heat Resistant Film 5) (Ni—Sn Plating: Plating of Nickel-Tin Alloy)

- Liquid composition: 2 to 30 g/L of nickel, 2 to 30 g/L of tin;
- pH: 1.5 to 4.5;
- Liquid temperature: 30 to 50° C.;
- Current density: 1 to 2 A/dm$^2$; and
- Coulomb amount: 1 to 2 As/dm$^2$.

(Plating Conditions for Heat Resistant Film 6) (Ni—P Plating: Plating of Nickel-Phosphorus Alloy)

- Liquid composition: 30 to 70 g/L of nickel, 0.2 to 1.2 g/L of phosphorus;
- pH: 1.5 to 2.5;
- Liquid temperature: 30 to 40° C.;
- Current density: 1 to 2 A/dm$^2$; and
- Coulomb amount: 1 to 2 As/dm$^2$.

(Plating Conditions for Heat Resistant Film 7) (Ni—W Plating: Plating of Nickel-Tungsten Alloy)

- Liquid composition: 2 to 30 g/L of nickel, 0.01 to 5 g/L of tungsten;
- pH: 3 to 4;
- Liquid temperature: 30 to 50° C.;
- Current density: 1 to 2 A/dm$^2$; and
- Coulomb amount: 1 to 2 As/dm$^2$.

(Deposition Conditions for Heat Resistant Film 8) (Ni—Cr Deposition: Deposition of Nickel-Chromium Alloy)

A nickel-chromium alloy deposition film is formed using a sputtering target having a composition of 65 to 85 mass % of nickel and 15 to 35 mass % of chromium.

- Target: 65 to 85 mass % of nickel, 15 to 35 mass % of chromium.
- Equipment: Sputtering equipment manufactured by ULVAC Inc.
- Output: DC 50 W; and
- Argon pressure: 0.2 Pa.

In the rust preventive treatment, the following rust preventive film and/or weather resistant film can be further formed on the electromagnetic wave absorption auxiliary film or the heat resistant film as described above. Each condition is shown below.

(Plating Conditions for Rust Preventive Film)

Liquid composition: 1 to 10 g/L of potassium dichromate, 0.2 to 0.5 g/L of zinc;

pH: 3 to 4;

Liquid temperature: 50 to 70° C.;

Current density: 0 to 2 A/dm$^2$ (0 A/dm$^2$ is for an immersion chromate treatment); and Coulomb amount: 0 to 2 As/dm$^2$ (0 As/dm$^2$ is for an immersion chromate treatment).

(Type of Weather Resistant Film (Silane Coupling Film))

One example is the application of an aqueous diaminosilane solution or an aqueous epoxysilane solution.

If the metal film or the plated film such as heat resistant films is provided by vapor deposition (dry plating) such as sputtering, and if the metal film or the plated film such as heat resistant films is provided by plating (wet plating) and the metal film or the plated film such as heat resistant films is normal plating (smooth plating, i.e., plating performed at a current density below limiting current density), the metal film or the plated film does not affect the shape of the surface of the non-magnetic metal layer.

Although the limiting current density varies depending on concentrations of metals, pH, feed rates, distances between poles, and temperatures of plating solutions, the limiting current density as used herein is defined as the current density at the boundary between normal plating (a plated metal is deposited in a form of film) and roughened plating (burnt plating; a plated metal is deposited in a form of crystal (in a form of spherical, needle, icicle, etc.); it has irregularities), and the current density (visually determined) at the limit of normal plating (just before burnt plating) in the Hull cell test is determined to be the limiting current density.

Specifically, the concentrations of the metals, pH, and the temperature of the plating solution are set to the production conditions for plating, and the Halsell test is conducted. The metal layer formation state (whether the plated metals are deposited in the form of layer or crystal) at the composition of the plating solution and at the temperature of the plating solution is then investigated. The current density at the boundary between normal plating and roughened plating is then determined from the position of the test piece where the boundary between normal plating and roughened plating exists, based on the current density quick reference table manufactured by YAMAMOTO-MS Co, Ltd. The current density at the boundary is then defined as the limiting current density. This gives the limiting current density at the composition of the plating solution and at the temperature of the plating solution. Generally, as a distance between poles is shorter, the limiting current density tends to be higher.

The Halsell test method is described, for example, in "Plating Practice Handbook" by Kiyoshi Maruyama, Jun. 30, 1983, pp. 157-160, Nikkan Kogyo Shimbun, Ltd.

To perform the plating process below the limiting current density, the current density during the plating process is preferably less than or equal to 20 A/dm$^2$, more preferably less than or equal to 10 A/dm$^2$, even more preferably less than or equal to 8 A/dm$^2$.

Further, the rust preventive film and the weather resistant film do not affect the shape of the surface of the non-magnetic metal layer because of their extremely thin thicknesses.

(Shielding Property)

According to one embodiment, it can have a magnetic field shielding property (how much the signal is attenuated on the receiving side) of 1 dB or more at 0.1 MHz, preferably 5 dB or more, more preferably 10 dB or more, even more preferably 15 dB or more, still more preferably 18 dB or more. In this invention, the magnetic field shielding property is measured by a KEC method. The KEC method refers to the "electromagnetic wave shielding property measurement method" in KEC Electronic Industry Development Center.

Application

In one embodiment, the present invention can be used for various electromagnetic wave shielding applications such as, particularly, covering or exterior materials for electrical and electronic apparatuses (e.g., inverters, communication devices, resonators, electron tubes and discharge lamps, electric heating devices, electric motors, generators, electronic components, printed circuits, medical devices, etc.), covering materials for harnesses and communication cables connected to electrical and electronic apparatuses, electromagnetic wave shielding sheets, electromagnetic wave shielding panels, electromagnetic wave shielding bags, electromagnetic wave shielding boxes, and electromagnetic wave shielding chambers.

EXAMPLES

The present invention will be specifically described based on Examples, Comparative Examples, and Reference Examples. The following Examples, Comparative Examples, and Reference Examples are only specific examples to facilitate understanding of the technical content of the present invention, and the technical scope of the present invention is not limited by these specific Examples.

The "Resin Layer", "Metal Layer", and "Magnetic layer" in Tables 1 and 2 correspond to the "non-magnetic resin layer", "non-magnetic metal layer", and "ferromagnetic layer", respectively.

Studies for Materials

Reference Examples 1-8

First, in Reference Examples 1-8, each material shown below was prepared, and values of the shape retention property, the elongation at break, the shielding property, and the anisotropy at break for each material were measured. The results are shown in Table 1. It should be noted that the RD direction of the magnetic layer 1 and the magnetic layer 2 means the longitudinal direction of the $A_4$ sample, and the TD direction means the width direction. Each measurement condition and evaluation criterion are described below. The symbol "-" in Table 1 indicates that no value was measured or that no measurement was conducted.

The resin layers 1 to 3, adhesive layer 1, metal layers 1 to 2, and magnetic layers 1 to 2 in Tables 1 and 2 are as follows:

Resin layer 1: a PET film (a thickness of 98 to 103 μm, EMBLET SD100, Unitika);

Resin layer 2: Teflon (registered trademark) sheet (a thickness of 99 μm, NITOFLON, Nitto Denko Corporation);

Adhesive layer 1: an adhesive (a thickness of 18 μm, RU-80, Rock Paint Co., Ltd);

Resin layer 3: Teflon (registered trademark) sheet (a thickness of 99 μm, NITOFLON, Nitto Denko Corporation) having an adhesive (a thickness of 18 μm, RU-80, Rock Paint Co., Ltd.) on one surface;

Metal layer 1: rolled copper foil (a thickness of 17.5 μm (nominal value), from JX Advanced Metals Corporation):

Metal layer 2: rolled copper foil (a thickness of 18 μm (nominal value), from JX Advanced Metals Corporation);

Magnetic layer 1: a composite sheet (a thickness of 90 to 96 μm, GM010S,

Takeuchi Kogyo, a relative permeability at 1 MHz frequency of about 24 (from Table in the catalog)); and Magnetic layer 2: a composite sheet (a thickness of 43 to 48 μm, P100NH, Takeuchi Kogyo, a relative permeability at 1 MHz frequency of about 130 (from Table in the catalog)).

(Shape Retention Property)

To evaluate the shape retention property of each material in Reference Example 1 and Reference Examples 5 to 8, formed bodies were prepared under conditions of room temperature (about 22 to 26° C.) according to the following procedure:

(1) Each material was held between the die and the holder of the processing machine shown in FIG. 1 (A).

(2) As shown in FIG. 1 (B), the punch was moved vertically downward along the die and holder and pushed into the die hole. The clearance between the die and the punch was set to 0.5 mm. The punch moving distance that does not cause cracks on the surface of the formed body when each material is formed is defined as a formable stroke shown in Table 1. It should be noted that the stroke was started at 3 mm, and an amount of movement was increased by 1 mm to check the appearance of the formed body. The formable stroke was set to 0 if the formed body caused the material fracture at 3 mm.

(3) As shown in FIG. 1 (C), the punch was moved vertically upward and returned to its original position. This provided a formed body having a bottomed shape.

(4) For the resulting formed bodies, the forming height of each formed body was measured on the day after the day of forming (after at least 12 hours) at room temperature (about 22 to 26° C.) using a confocal microscope (ONE-SHOT 3D VR-5000, Keyence) by measuring the minimum distance in the vertical direction from the height position of the surface on the folder side of the formed body sandwiched between the die and the holder to the height position of the inner surface of the bottom portion.

According to the above procedure, the ratio (B/A) of the "height of the formed body (B)" to the "formable stroke (A)" obtained was calculated.

Overall Judgment

The case where the above ratio (B/A) was 75% or more is evaluated as "○", the case where the above ratio (B/A) was 50% or more and less than 75% was evaluated as "Δ", and the case where the above ratio (B/A) was less than 50% is evaluated as "x". The results are shown in Table 1.

(Elongation at Break)

The elongation at break in the RD direction and/or the TD direction was measured for each material in Reference Example 1 and Reference Examples 4 to 8. The elongation at break was measured at room temperature (about 22 to 26° C.) by the method as described above. The results are shown in Table 1.

(Shielding Property)

The Shielding property was measured for each of the materials of Reference Examples 1 to 8. First, the outer circumferential portion of each material was fixed with tape to prevent misalignment during the measurement. For each material, the magnetic field shielding property at 0.1 MHz was evaluated at room temperature (about 22 to 26° C.) in accordance with the KEC method using a magnetic field measurement jig of a KEC method shielding effect measurement device (JSE-KEC from TechnoScience), a network analyzer (E5080 from Keysight Technologies), and an amplifier (MH648A from Anritsu), and the results are shown in Table 1.

Overall Judgment

The case where the value of the magnetic field shielding property at 0.1 MHz was 10 dB or more was evaluated as "○", the case where the value of the magnetic field shielding property was 1 dB or more and less than 10 dB was evaluated as "Δ", and the case where the value of the magnetic field shielding property was less than 1 dB was evaluated as "x". The results are shown in Table 1.

(Anisotropy at Break)

The value of the anisotropy at break was measured for each of the materials of Reference Examples 1 to 8. The measurement method for the value of the anisotropy at break was performed at room temperature (about 22 to 26° C.) by the method as described above. The results are shown in Table 1.

TABLE 1

| | Structure | | Evaluation Results | | | | | | | | |
|---|---|---|---|---|---|---|---|---|---|---|---|
| | | | Shape Retention Property | | | | Elongation at Break | | Shielding Effect | | |
| | Material | Thickness [μm] | Formable Stroke (A) [mm] | Formed Body Height (B) [mm] | Ratio (B/A) [%] | Judgment Results | RD Direction [%] | TD Direction [%] | Value at 0.1 MHz [dB] | Judgment Results | Anisotropy at Break Rc |
| Reference Example 1 | Resin Layer 1 | 100 | 8 | 7.47 | 93 | ○ | 151 | 103 | 0 | x | 1.86 |
| Reference Example 2 | Resin Layer 2 | 99 | — | — | — | — | — | — | 0 | x | 1.81 |
| Reference Example 3 | Resin Layer 3 | 117 | — | — | — | — | — | — | 0 | x | 1.80 |
| Reference Example 4 | Adhesive Layer 1 | 18 | — | — | — | — | — | 55.2 | 0 | x | 0.80 |
| Reference Example 5 | Metal Layer 1 | 17.5 | 0 | 0 | — | — | 8 | 8 | 10.2 | ○ | 0.56 |
| Reference Example 6 | Metal Layer 2 | 18 | 0 | 0 | — | — | 8 | 8 | 10.4 | ○ | 0.56 |

TABLE 1-continued

| | Structure | | Evaluation Results | | | | | | | | |
|---|---|---|---|---|---|---|---|---|---|---|---|
| | | | Shape Retention Property | | | | Elongation at Break | | Shielding Effect | | |
| | Material | Thickness [μm] | Formable Stroke (A) [mm] | Formed Body Height (B) [mm] | Ratio (B/A) [%] | Judgment Results | RD Direction [%] | TD Direction [%] | Value at 0.1 MHz [dB] | Judgment Results | Anisotropy at Break Rc |
| Reference Example 7 | Magnetic Layer 1 | 93 | 3 | 1.26 | 42 | x | 13 | 55 | 3.0 | ○ | 0.92 |
| Reference Example 8 | Magnetic Layer 2 | 45 | 3 | 1.07 | 36 | x | 25 | 22 | 2.0 | Δ | 0.83 |

Discussion of Reference Examples

For the resin layer 3 having the adhesive layer 1 on the resin layer 2, the value of Rc was almost the same as that of the resin layer 2. Since the Rc values of the resin layer 1 and the resin layer 2 were almost the same, the similar trend would be confirmed even if the Rc values of the resin layers having the adhesive layer 1 were measured. It would also be supposed that even if the adhesive layer is possessed on the non-magnetic resin layer, it has substantially no effect on the Rc value. Furthermore, as shown in Reference Examples 7 and 8, when the value of Rc was greater than 0 and less than 1, it could be formed at a formable stroke of 3 mm, but the percentage related to the shape retention property was less than 50%, indicating that the shape retention property was poor.

Preparation of Electromagnetic Wave Shielding Material

Examples 1-13, Comparative Examples 1-3

Next, as Comparative Example 1, the laminate 1 was prepared as a commercially available electromagnetic wave shielding material, and the values of the shape retention property, the elongation at break, the shielding property, and the anisotropy at break were measured as in Reference Examples. The results are shown in Table 2. The composition of the laminate 1 is as follows:

Laminate 1: a magnetic shield sheet (a thickness of 120 μm, FM SHIELD (registered trademark), Hitachi Metals).

According to the catalog, the above laminate 1 is laminated in the following order: a resin layer (PET film (a thickness of 25 μm))/an adhesive (a hot melt adhesive (a thickness of 25 μm))/a magnetic layer 3 (a thickness of 18 μm, FINEMET (registered trademark), manufactured by Hitachi Metals, a specific magnetic permeability at 1 MHz frequency of approximately 5000 (from the table in the catalog))/an adhesive (a hot melt adhesive (a thickness of 25 μm))/a resin layer (a PET film (a thickness of 25 μm)). In other words, the above laminate 1 has the configuration of the non-magnetic resin layer/the ferromagnetic layer/the non-magnetic resin layer.

In Examples 1-13 and Comparative Examples 2-3, the materials from Reference Examples 1-8 and the adhesive layer 2 shown below were combined as appropriate to produce the electromagnetic wave shielding materials. Then, in each of Examples 1-13 and Comparative Examples 2-3, the values of the shape retention property, the elongation at break, the shielding property, and the anisotropy at break were measured as in the Reference Examples. The results are shown in Table 2. The areas of the lamination surfaces of the resin layer 1, the metal layers 1-2, and the magnetic layers 1-2 were the same, and these layers were laminated so that they did not protrude from each other. In the example using the PET film for the resin layer 1 and the copper foil for the metal layer 1, the adhesive (two-component urethane resin adhesive; main agent: RU 80, curing agent: H-5, from Rock Paint Co., Ltd.) was applied to the lamination surface of the PET film with a bar coater. In such a case, one resin layer is composed of the laminate of the PET film and the adhesive layer. The resin layer 1 or the metal layer 1 or the metal layer 2 was attached to the outer surface of the adhesive layer already formed on the magnetic layers 1-2. The adhesive layer 2 is as follows:

Adhesive layer 2: an adhesive (a thickness of 4.5 μm, RU-80, Rock Paint Co., Ltd.).

TABLE 2

| | Structure of Laminate | | Evaluation Results | | | | | | | | |
|---|---|---|---|---|---|---|---|---|---|---|---|
| | | | Shape Retention Property | | | | Elongation at Break | | Shielding Effect | | |
| | Materials | Total Thickness [μm] | Formable Stroke (A) [mm] | Formed Body Height (B) [mm] | Ratio (B/A) [%] | Judgment Results | RD Direction [%] | TD Direction [%] | Value at 0.1 MHz [dB] | Judgment Results | Anisotropy at Break Rc |
| Example 1 | Resin Layer 1/Magnetic Layer 1/Resin Layer 1 | 309 | 9 | 7.09 | 79 | ○ | 183 | 134 | 1.7 | Δ | 1.31 |
| Example 2 | Resin Layer 1/Magnetic Layer 1/Resin Layer 1/Magnetic Layer 1/Resin Layer 1 | 497 | 5 | 4.65 | 93 | ○ | 162 | 125 | 2.5 | Δ | −4.97 |
| Example 3 | Resin Layer 1/Metal Layer 2/Magnetic Layer 1 | 220 | 5 | 4.85 | 97 | ○ | 83 | 95 | 11.3 | ○ | −3.42 |

TABLE 2-continued

| | Structure of Laminate | | Evaluation Results | | | | | | | | | |
|---|---|---|---|---|---|---|---|---|---|---|---|---|
| | | | Shape Retention Property | | | | | | | | | Anisotropy |
| | | Total | | Formed | | | Elongation at Break | | Shielding Effect | | | at Break |
| | Materials | Thickness [μm] | Formable Stroke (A) [mm] | Body Height (B) [mm] | Ratio (B/A) [%] | Judgment Results | RD Direction [%] | TD Direction [%] | Value at 0.1 MHz [dB] | Judgment Results | | Rc |
| Example 4 | Resin Layer 1/Metal Layer 2/ Magnetic Layer 2 | 197 | 5 | 4.52 | 90 | ○ | 84 | 66 | 13.8 | ○ | | −1.08 |
| Example 5 | Metal Layer 1/Magnetic Layer 1/ Resin Layer 1 | 220 | 3 | 2.26 | 75 | ○ | 183 | 131 | 11.9 | ○ | | −0.93 |
| Example 6 | Resin Layer 1/Metal Layer 2/ Magnetic Layer 1/Resin Layer 1 | 329 | 6 | 5.78 | 96 | ○ | 128 | 94 | 11.5 | ○ | | 1.36 |
| Example 7 | Metal Layer 1/Resin Layer 1/ Magnetic Layer 1/Resin Layer 1 | 330 | 3 | 2.93 | 98 | ○ | 72 | 88 | 11.5 | ○ | | 4.30 |
| Example 8 | Resin Layer 1/Metal Layer 2/ Magnetic Layer 1/Metal Layer 2/ Resin Layer 1 | 380 | 4 | 3.38 | 85 | ○ | 78 | 86 | 18.6 | ○ | | −1.93 |
| Example 9 | Resin Layer 1/Metal Layer 2/ Magnetic Layer 1/Metal Layer 2/ Magnetic Layer 1/Resin Layer 1 | 443 | 3 | 2.95 | 98 | ○ | 35 | 84 | 18.7 | ○ | | −0.70 |
| Example 10 | Resin Layer 1/Metal Layer 2/ Resin Layer 1/Magnetic Layer 2/ Resin Layer 1/Metal Layer 2/ Resin Layer 1 | 544 | 6 | 5.53 | 92 | ○ | 121 | 48 | 23 | ○ | | −2.41 |
| Example 11 | Resin Layer 1/Magnetic Layer 2/ Resin Layer 1/Metal Layer 1 | 308 | 8 | 6.56 | 82 | ○ | 58 | 43 | 14.1 | ○ | | −4.78 |
| Example 12 | Resin Layer 1/Magnetic Layer 2/ Resin Layer 1/Metal Layer 1/ Resin Layer 1 | 419 | 8 | 7.47 | 93 | ○ | 75 | 64 | 13.9 | ○ | | −1.18 |
| Example 13 | Metal Layer 1/Resin Layer 1/ Magnetic Layer 1/Metal Layer 1 | 267 | 8 | 7.05 | 88 | ○ | 13 | 45 | 17.4 | ○ | | −1.08 |
| Comparative Example 1 | Laminate 1 (Resin Layer/ Magnetic Layer 3/Resin Layer) | 120 | 0 | 0 | — | — | <1 | <1 | 15.0 | ○ | | 0.87 |
| Comparative Example 2 | Adhesive Layer 2/Metal Layer 2/ Adhesive Layer 2 | 27 | 0 | 0 | — | — | <1 | <1 | 15.0 | ○ | | 0.40 |
| Comparative Example 3 | Metal Layer 1/Magnetic Layer 1/ Metal Layer 1 | 137 | 0 | 0 | — | — | 18 | 18 | 13.6 | ○ | | 0.54 |

Discussion of Examples and Comparative Examples

Examples 1-13 showed the improved shape retention property and the good shielding property. Therefore, in Examples 1-13, it can be said that the electromagnetic wave shielding material including the laminate having the non-magnetic resin layer and the non-magnetic metal layer and/or the ferromagnetic layer, wherein the value of the anisotropy at break (Rc) represented by the above equation (1) is 0 or less or 1 or more, is useful.

Although metals other than copper can also be applied as the non-magnetic metal layer, aluminum has lower tensile strength and is more easily deformed than copper, so it is assumed that it also provides the effect of improving the formability by the lamination.

In particular, the use of one or more layers for each of the non-magnetic resin layer, the non-magnetic metal layer, and the ferromagnetic layer to laminate them together could achieve the shielding property at 0.1 MHz of 10 dB or more, and could also provide the excellent laminate as an electromagnetic wave shielding material.

On the other hand, in Comparative Examples 1-3, the formed bodies could not be produced. Considering the results of Comparative Examples 1-3 and Reference Examples 1-8, it is supposed that if the value of the anisotropy at break (Rc) is 0 or less or 1 or more, the electromagnetic wave shielding material does not have the improved shape retention property.

The invention claimed is:

1. An electromagnetic wave shielding material comprising a laminate with at least one non-magnetic resin layer and at least one non-magnetic metal layer and/or at least one ferromagnetic layer, wherein a value of an anisotropy at break (Rc) represented by the following equation (1) is 0 or less or 1 or more:

[Equation 1]

$$Rc = \frac{\ln\left(\frac{w}{w_0}\right)}{\ln\left(\frac{t}{t_0}\right)} \quad (1)$$

in which:

Rc is an anisotropy at break;

W is a width (mm) of a ruptured portion after a tensile test of the laminate;

$W_0$ is a width (mm) of the laminate before the tensile test;

t is a thickness (μm) of the ruptured portion after the tensile test of the laminate; and $t_0$ is a thickness (μm) of the laminate before the tensile test.

2. The electromagnetic wave shielding material according to claim 1, wherein the laminate has the non-magnetic metal layer, and the electromagnetic wave shielding material has the non-magnetic resin layers on both surfaces of the non-magnetic metal layer.

3. The electromagnetic wave shielding material according to claim 1, wherein the laminate has the ferromagnetic layer, and the electromagnetic wave shielding material has the non-magnetic resin layers on both surfaces of the ferromagnetic layer.

4. The electromagnetic wave shielding material according to claim 1, wherein the non-magnetic metal layer has a thickness of 10 to 200 μm and comprises at least one metal having an elongation at break of 2% or more in an RD direction.

5. The electromagnetic wave shielding material according to claim 1, wherein the non-magnetic metal layer comprises at least one selected from copper, a copper alloy, aluminum, and an aluminum alloy.

6. The electromagnetic wave shielding material according to claim 1, wherein a value of an anisotropy at break (Rc) of the non-magnetic resin layer represented by the equation (2) is 1.0 or more and 10 or less, or −10 or more and 0 or less:

[Equation 2]

$$Rc = \frac{\ln\left(\frac{w}{w_0}\right)}{\ln\left(\frac{t}{t_0}\right)} \tag{2}$$

in which:

Rc is an anisotropy at break;

W is a width (mm) of a ruptured portion after a tensile test of the non-magnetic resin layer;

$W_0$ is a width (mm) of the non-magnetic resin layer before the tensile test;

t is a thickness (μm) of the ruptured portion after the tensile test of the non-magnetic resin layer; and $t_0$ is a thickness (μm) of the non-magnetic resin layer before a tensile test.

7. The electromagnetic wave shielding material according to claim 1, wherein the non-magnetic resin layer comprises at least one selected from PET and PC.

8. The electromagnetic wave shielding material according to claim 1, wherein the non-magnetic resin layer comprises conductive particles and/or conductive fibers.

9. A covering material or an exterior material for electrical and electronic apparatuses, the covering material or the exterior material comprising the electromagnetic wave shielding material according to claim 1.

10. An electrical and electronic apparatus comprising the covering material or the exterior material according to claim 9.

* * * * *